United States Patent
Figura et al.

(10) Patent No.: US 6,716,769 B1
(45) Date of Patent: Apr. 6, 2004

(54) USE OF A PLASMA SOURCE TO FORM A LAYER DURING THE FORMATION OF A SEMICONDUCTOR DEVICE

(75) Inventors: Thomas A. Figura, Boise, ID (US); Kevin G. Donohoe, Boise, ID (US); Thomas Dunbar, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/470,650

(22) Filed: Dec. 22, 1999

Related U.S. Application Data

(62) Division of application No. 09/046,835, filed on Oct. 24, 1997, now Pat. No. 6,117,764, which is a continuation of application No. 08/787,453, filed on Jan. 22, 1997, now Pat. No. 5,950,092, which is a continuation of application No. 08/458,861, filed on Jun. 2, 1995, now abandoned.

(51) Int. Cl.$^7$ .............................................. H01L 21/369
(52) U.S. Cl. ........................ 438/780; 438/399; 438/639; 438/699; 438/672; 438/913; 438/976
(58) Field of Search ................ 438/399, 639, 438/699, 672, 780, 913, 976

(56) References Cited

U.S. PATENT DOCUMENTS

| 4,759,958 A | 7/1988 | Numata et al. | 427/255.6 |
| 4,797,373 A | 1/1989 | Malhi et al. | 437/60 |
| 4,830,691 A | 5/1989 | Kida et al. | 156/631 |

(List continued on next page.)

FOREIGN PATENT DOCUMENTS

| EP | 0721205 | | 7/1996 | | |
| JP | 59-103338 | * | 6/1984 | .......... | H01L/21/302 |
| JP | 62-030330 | * | 2/1987 | .......... | H01L/21/302 |
| JP | 62-032618 | * | 2/1987 | .......... | H01L/21/205 |
| JP | 01-149418 | * | 6/1989 | .......... | H01L/21/20 |
| JP | 06-275568 | * | 9/1994 | .......... | H01L/21/302 |

OTHER PUBLICATIONS

"A comparison of HDP oxide and Spin–On polymer for Intermetal dielectric applications in sub–half micron devices", Zheng et al., DUMIC conferencepp. 283–293 (pp. 288, 290, and 292 are blank), Feb. 10, 1997.*
"Diagnostic Investigation of Oxide etching in a commercial high–density plasma etcher", John Arnold, The American Physical Society, Oct. 21, 1996.*
Guidelines for Examination of Patent Applications under 35 U.S.C. 112, 66 Fed. Reg. 1099 (2001), pp. 1106–1107.*
Application Ser. No. 09/470,651, entitled Use of a Plasma Source to Form a Layer During the Formation of a Semiconductor Device, filed Dec. 22, 1999; Thomas A. Figura, Kevin Donohoe, and Thomas Dunbar, inventors; Preliminary Amendment filed Dec. 22, 1999; Amendment After the Continued Prosecution Application and Response to the Office Action dated Apr. 13, 2000 filed Jul. 13, 2000; Response to the Office Action dated Sep. 26, 2000 filed Oct. 5, 2000; Amendment and Response to the Office Action Dated Nov. 21, 2000 filed May 21, 2001.

(List continued on next page.)

Primary Examiner—Evan Pert
Assistant Examiner—Lisa Kilday
(74) Attorney, Agent, or Firm—Charles Brantley

(57) ABSTRACT

A method used to form a semiconductor device having a capacitor comprises placing a semiconductor wafer assembly into a chamber of a plasma source, the wafer assembly comprising a layer of insulation having at least one contact therein and a surface, and further comprising a conductive layer over the surface and in the contact. Next, in the chamber, a layer of etch resistant material is formed within the contact over the conductive layer, the etch resistant material not forming over the surface.

3 Claims, 2 Drawing Sheets

U.S. PATENT DOCUMENTS

| | | | |
|---|---|---|---|
| 4,918,033 A | 4/1990 | Bartha et al. | 437/245 |
| 5,066,607 A | 11/1991 | Banerjee | 437/52 |
| 5,079,178 A | 1/1992 | Chouan et al. | 437/40 |
| 5,084,413 A | 1/1992 | Fujita et al. | 437/189 |
| 5,093,279 A | 3/1992 | Andreshak et al. | 437/173 |
| 5,096,849 A | 3/1992 | Beilstein, Jr. et al. | 437/67 |
| 5,110,712 A | 5/1992 | Kessler et al. | 430/312 |
| 5,150,276 A | 9/1992 | Gonzalez et al. | 361/313 |
| 5,162,248 A | 11/1992 | Dennison et al. | 437/52 |
| 5,164,332 A | 11/1992 | Kumar | 437/198 |
| 5,182,230 A | 1/1993 | Donelon et al. | 437/173 |
| 5,185,282 A | 2/1993 | Lee et al. | 437/47 |
| 5,232,509 A | 8/1993 | Min et al. | 118/723 |
| 5,252,988 A | 10/1993 | Katayama et al. | 346/76 PH |
| 5,284,787 A | 2/1994 | Ahn | 437/52 |
| 5,286,675 A | 2/1994 | Chen et al. | 437/195 |
| 5,292,677 A | 3/1994 | Dennison | 437/52 |
| 5,312,773 A | 5/1994 | Nagashima | 437/190 |
| 5,316,616 A * | 5/1994 | Nakamura et al. | 438/713 |
| 5,326,431 A | 7/1994 | Kadomura | 156/659.1 |
| 5,354,715 A | 10/1994 | Wang et al. | 437/238 |
| 5,364,809 A | 11/1994 | Kwon et al. | 437/52 |
| 5,364,817 A | 11/1994 | Lur et al. | 437/192 |
| 5,382,316 A | 1/1995 | Hills et al. | 156/643 |
| 5,419,822 A * | 5/1995 | Dakesian et al. | 204/192.3 |
| 5,422,294 A | 6/1995 | Noble, Jr. | 437/52 |
| 5,422,310 A | 6/1995 | Ito | 437/192 |
| 5,441,594 A * | 8/1995 | Zenke | 156/643.1 |
| 5,443,941 A | 8/1995 | Bariya et al. | 430/313 |
| 5,472,564 A * | 12/1995 | Nakamura et al. | 438/719 |
| 5,472,904 A | 12/1995 | Figura et al. | 437/67 |
| 5,476,817 A | 12/1995 | Numata | 437/195 |
| 5,486,493 A | 1/1996 | Jeng | 437/195 |
| 5,496,773 A | 3/1996 | Rhodes et al. | 437/189 |
| 5,562,801 A | 10/1996 | Nulty | 156/643.1 |
| 5,565,384 A | 10/1996 | Havemann | 437/228 |
| 5,783,101 A | 7/1998 | Ma et al. | 216/68 |
| 5,788,870 A | 8/1998 | Nguyen et al. | 216/63 |
| 5,804,259 A * | 9/1998 | Robles | 427/122 |
| 5,821,621 A | 10/1998 | Jeng | 257/759 |
| 5,837,596 A | 11/1998 | Figura et al. | 438/446 |
| 5,904,799 A | 5/1999 | Donohoe | 156/345 |
| 5,950,092 A | 9/1999 | Figura et al. | 438/399 |
| 6,089,183 A | 7/2000 | Imai et al. | 118/215 |
| 6,117,764 A | 9/2000 | Figura et al. | 438/623 |

OTHER PUBLICATIONS

Application Ser. No. 09/471,460, entitled Use of a Plasma Source to Form a Layer During the Formation of a Semiconductor Device, filed Dec. 22, 1999; Thomas A. Figura, Kevin G. Donohoe and Thomas Dunbar, inventors; Preliminary Amendment filed Dec. 22, 1999; Amendment After the Continued Prosecution Application and Response to the Office Action dated Jun. 6, 2000; Amendment and Response to the Office Action dated Nov. 21, 2000, filed May 21, 2001.

Tetsuo Ono, Ryoji Hamasaki and Tatsumi Mizutani, "Mechanism for CF Polymer Film Deposition through Deep $SiO_2$ Holes in Electron Cyclotron Resonance Plasma," Jpn. J. Appl. Phys. vol. 35, pp. 2468–2471, Part 1, No. 4B, Apr. 1996.

Ephrath, L. M., "Teflon Polymer Mask For RIE of Contact Roles", IBM Technical Disclosure Bulletin, vol. 25, No. 9, pp. 4587–4588, Feb. 1983.

* cited by examiner

US 6,716,769 B1

USE OF A PLASMA SOURCE TO FORM A LAYER DURING THE FORMATION OF A SEMICONDUCTOR DEVICE

This application is a divisional of a pending U.S. application Ser. No. 09/046,835, filed on Oct. 24, 1997 now U.S. Pat. No. 6,117,764 which is a continuation of U.S. application Ser. No. 08/787,453, filed Jan. 22, 1997 and issued on Sep. 7, 1999 as U.S. Pat. No. 5,950,092; which is a continuation of U.S. application Ser. No. 08/458,861, filed Jun. 2, 1995 and now abandoned.

FIELD OF THE INVENTION

The invention relates to the field of semiconductor manufacture, and more specifically to a method for forming and etching layers during the formation of a semiconductor device.

BACKGROUND OF THE INVENTION

A typical structure formed during the manufacture of a semiconductor memory device is a container cell which requires several steps for its manufacture. A sample process for forming the container cell includes implanting a diffusion area in a semiconductor wafer substrate, and forming an insulator, such as borophosphosilicate glass (BPSG) or tetraethylorthosilicate (TEOS), over the wafer. The insulator is etched to open a contact, usually round or oval in shape, to expose the diffusion region. A compliant conductive layer such as doped polycrystalline silicon is formed over the wafer surface and within the contact which contacts the diffusion region. The conductive layer is masked to protect the portion within the contact and the remainder is etched. Various steps as known in the art are subsequently performed to produce a container cell.

The process described above requires the wafer to be transported between several chambers. The diffusion region is formed in an implanter, and the insulator, usually a blanket layer, is formed either in a furnace (to form TEOS) or in a chemical vapor deposition tool such as a Watkins-Johnson to form BPSG. Plasma-enhanced chemical vapor deposition (PECVD) and various other means can be used to form the insulator. The wafer is then moved to a stepper for patterning of the insulator, then to a dry etch chamber where the insulator is etched to form the contact. The wafer is moved again to a furnace, a low-pressure chemical vapor deposition (LPCVD) chamber, or a PECVD chamber to form a blanket conductive layer over the wafer surface and within the contact. Next, the conductive layer on the surface of the wafer is removed, for example using chemical mechanical planarization (CMP) equipment. The conductive layer can also be removed by forming a resist coat over the wafer, which forms a thicker layer within the contact than on the wafer surface, and dry etching the surface to remove the resist and poly from the surface while leaving a portion of the poly within the contact. Finally, the wafer is moved to an acid bath or a plasma etcher where the resist is stripped from the contact.

Transporting the wafer is not desirable as it increases processing time, costs, and possible damage and contamination to the wafer. A process which requires less wafer transportation is therefore desirable.

SUMMARY OF THE INVENTION

A first embodiment of the invention is a method used during the formation of a semiconductor device comprising placing a semiconductor wafer having a surface and a recess formed in the wafer into a chamber of a plasma source. Within the chamber, a layer of etch resistant material is formed within the recess and over the surface of the wafer. Finally, also in the chamber, the etch resistant layer which forms over the surface of the wafer is removed and at least a portion of the etch resistant layer is left in the recess.

A second embodiment of the invention comprises a method used during the formation of a semiconductor device comprising placing a semiconductor wafer having a surface and a recess formed in the wafer into a chamber of a plasma source. Within the chamber, a layer of etch resistant material is formed within the recess, the etch resistant material not forming over the surface.

Objects and advantages will become apparent to those skilled in the art from the following detailed description read in conjunction with the appended claims and the drawing attached hereto.

It should be emphasized that the drawings herein are not to scale but are merely schematic representations and are not intended to portray the specific parameters or the structural details of the invention, which can be determined by one of skill in the art by examination of the information herein.

DETAILED DESCRIPTION OF THE INVENTION

FIGS. 1–4 are cross-sections of a first embodiment of the invention used to form a storage node of a container cell. It should be noted that the invention can be used to form a number of other structures, and the use of the invention to form a storage node of a container cell is for ease of explanation.

Figure 1:
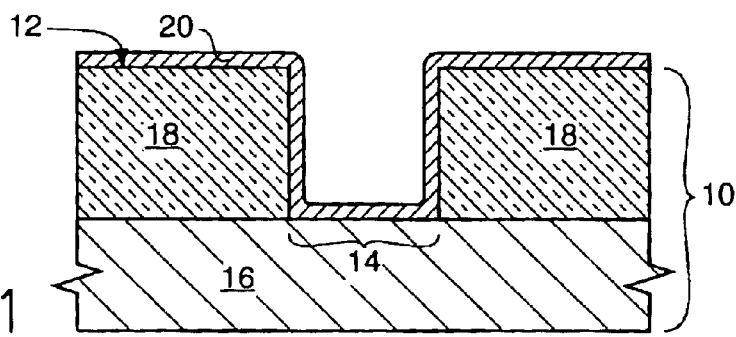
FIGS. 1–4 are cross-sections of a first embodiment of the invention.

A starting structure is shown in FIG. 1. The starting structure comprises a wafer 10 having a surface 12 and a contact 14 formed in the wafer. The wafer shown comprises a substrate 16, for example of silicon or gallium arsenide, and insulator 18, such as an oxide or a nitride, with the contact formed in the insulator. The specific use of the invention shown further comprises a conductive layer 20 such as a conformal layer of polycrystalline silicon formed within the contact 14 and over the wafer surface 12 which contacts the substrate 16. The invention is described for a staring structure using a 1,000 Å to 20,000 Å thick BPSG layer as the insulator, a contact 0.2 to 1.0 microns in diameter, and a polycrystalline silicon conductor layer 200–2,000 Å thick. Etcher settings listed below may require modification for different materials and/or thicknesses, which can easily be determined by one of ordinary skill in the art from the description herein without undue experimentation.

Figure 2:
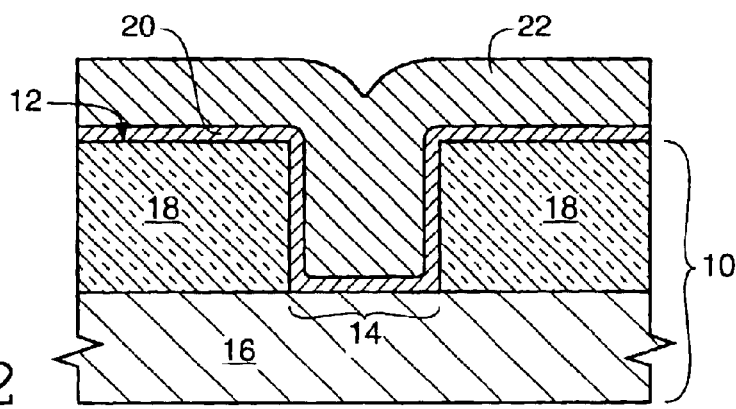

The structure of FIG. 1 is placed into a chamber of a plasma source such as a conventional plasma etcher or a high density plasma etcher. High density plasma etchers operate at pressures below 50 millitorr (typically below 10 millitorr) and have plasma densities greater than $10^{10}$ to $10^{11}$ $cm^{-3}$. In addition, most etch applications of high density plasma etchers use two sources of electrical power, one to generate the plasma and one to bias the wafer. The plasma source can be an etcher such as an Applied Materials Model 5300 HDP, LAM TCP, or other such etcher. A layer of etch resistant material 22, such as a polymer, is formed within the contact 14 and over the surface 12 of the wafer 10 as shown in FIG. 2. The etch resistant material bridges across the contact and fills in the contact. In general, any feed gas which forms an etch resistant layer can be used. For example, fluorocarbons, hydrofluorocarbons, chlorofluorocarbons, halocarbons or hydrohalocarbons would function sufficiently. Examples include $CHF_3$, $CH_2F_2$, $C_2F_6$, $C_2HF_5$, $C_3F_8$. The flow rate depends on which feed gas is used, and can be determined by one of skill in the art from the description herein without undue experimentation. Generally, flow rates would be in the range of 25–200 standard cubic centimeters (sccm) although flow rates outside this range may function adequately. To bridge over a contact 0.5 microns in diameter and form a polymer layer about 2000 angstroms (Å) thick over the wafer surface, the following settings can be used:

Source (top) Power: From 1000 to 3500 Watts
    Bias (bottom) Power: From 0 to 400 Watts
    Pressure: From 2 to 5 Millitorr
    Duration: From 5 to 40 Seconds
    Flow Rate: From 10 to 50 SCCM These settings usually cause the etch resistant layer formed on the surface to be thinner than the material formed within the contact. It should be noted that there is an interaction between the listed parameters, and other settings in addition to the ranges listed above may also function adequately. The settings herein can be altered by one of ordinary skill in the art from the description herein to customize the etch resistant layer formation for various sizes and shapes of contact, and for various thicknesses within the contact and over the wafer surface. Depending on the application, any thickness of etch-resistant layer may be useful, but an etch-resistant layer 50 Å or greater is preferred for most applications.

Figure 3:
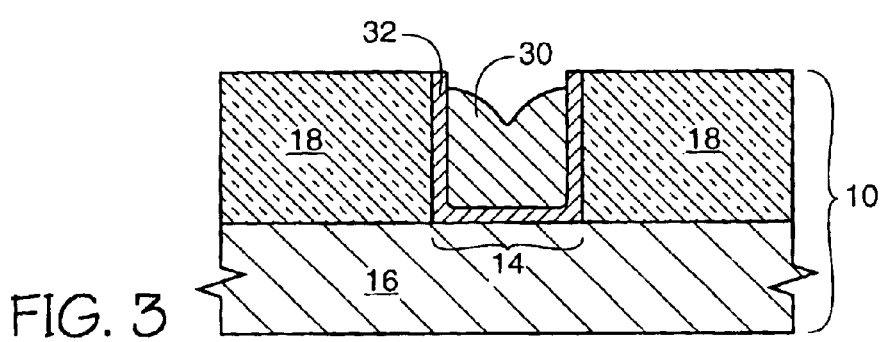

Next, within the chamber, the etch resistant layer is removed from the wafer surface as shown in FIG. 3 using parameters known in the art. Because the etch resistant layer bridges across the contact, and essentially forms a thicker layer within the contact, the layer can be removed from the surface while at least a portion 30 of the layer remains within the contact as shown in FIG. 3. In addition, the portion of the conductive layer 20 on the wafer surface 12 can also be removed using the same settings used to remove the etch resistant layer from the wafer surface, or different settings can be used depending on the material of layer 20. The remaining portion of the etch resistant layer 30 functions as a mask to protect the conductive layer 32 within the contact.

Figure 4:
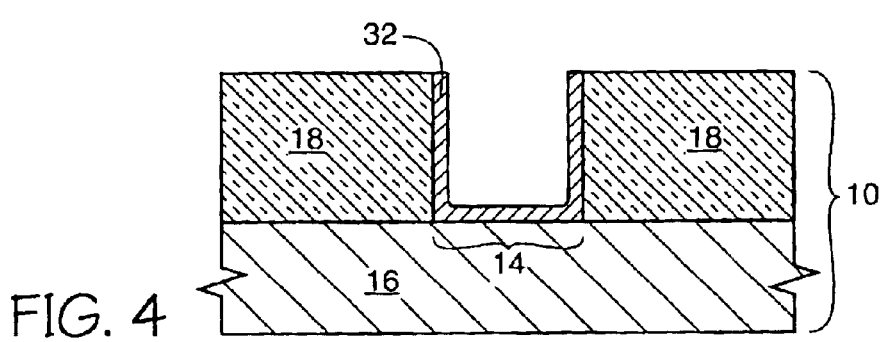

The etch resistant layer 30 can be removed, for example within the chamber, to expose the conductive layer 32 to result in the structure of FIG. 4. The etch resistant layer 30 can be removed using etcher settings similar to those used for stripping photoresist. Oxygen-fluorocarbon mixtures are best suited for this since layer 30 may comprise some silicon. Using subsequent processing steps element 32 can function as a capacitor storage node, although there are many other uses for the inventive method. Removal of insulator 18 can be accomplished with any means, such as within the etch chamber or outside the chamber, for example in a hydrofluoric acid (HF) sink.

Figure 5:
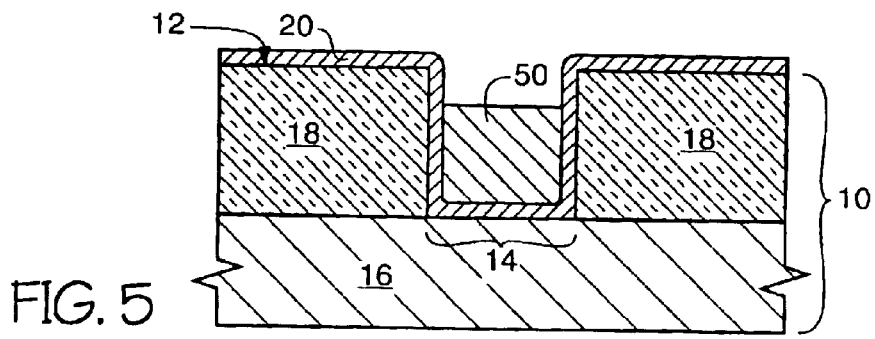
FIGS. 5–6 are cross-sections of a second embodiment of the invention.
Figure 6:
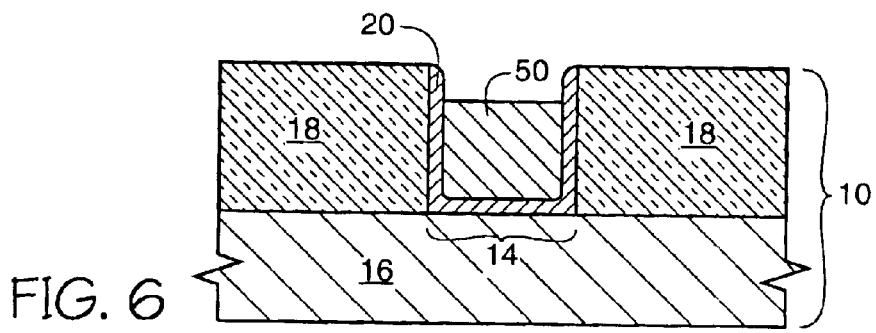

A second embodiment of the invention is shown in FIGS. 5 and 6. The starting structure of FIG. 1 is placed into a chamber of a plasma source. Using a combination of etcher settings, an etch resistant layer 50 can be formed within the contact 14, or other narrow openings, without the etch resistant layer forming on the wafer surface 12 to result in the structure of FIG. 5. The thickness of the etch resistant layer which forms within the contact is dependent on the duration of the step. As the layer thickens its rate of formation slows and may eventually stop. Forming the etch resistant layer in the contact and not on the wafer surface results in part from operating at a higher bias voltage and under conditions of lower deposition rate than in the first embodiment. For example, in the Applied Materials HDP Etch tool, these conditions would include lowering the source power and decreasing the total flow rate of process gasses. The specific values of the operating parameters can be adjusted by one of skill in the art from the information herein.

The etch resistant layer can then be used as a mask and the conductive layer 20 can be etched with a separate etch step, for example in the same etch chamber, according to means known in the art. Next, the etch resistant layer 50 can be removed as described with the first embodiment above to result in the structure of FIG. 4.

Figure 7:
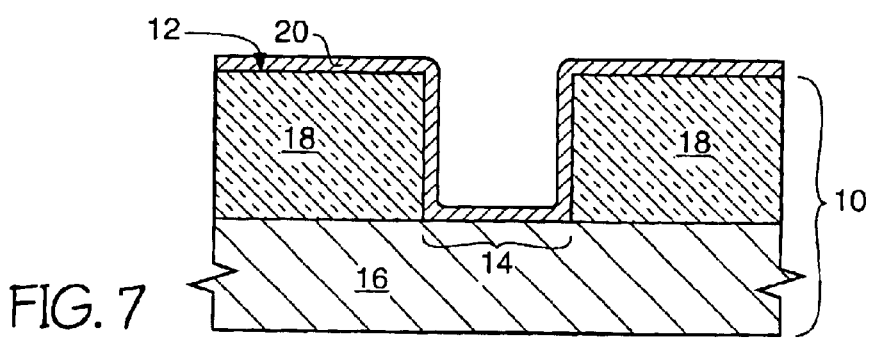
FIGS. 7–8 are cross-sections of a third embodiment of the invention.
Figure 8:
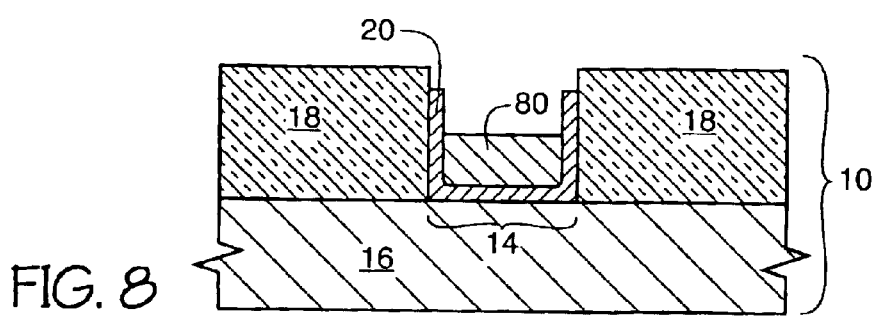

A third embodiment of the invention is shown in FIGS. 7–8. The starting structure of FIG. 7 is placed in an etch chamber. By decreasing the deposition rate and increasing the bias of the settings shown for the first embodiment, an etch resistant layer 80 can be formed within the contact 14 while, simultaneously, the conductive layer 20 is etched from the surface of the wafer. As the polymer builds up over the conductive layer 20 within the contact 14, it functions as a mask and protects the horizontal surface of the conductive layer in the contact. The conductive layer is simultaneously removed from the surface of the wafer. Some attack on the top of 20 may occur with this embodiment, but such an attack does not affect the performance of the container cell.

The inventive method as described in the embodiments above has the advantage of forming a mask in an etch chamber. Subsequent etches can also be performed within the chamber. Performing a number of different steps within the etch chamber decreases the transportation requirements of the wafer which reduces production time and decreases damage resulting from handling of the wafers.

The three embodiments described have various deposition rates of the polymer on the wafer surface compared with the deposition rate of the polymer within the recess. With the first embodiment, the polymer forms faster within the recess than on the wafer surface. In the second embodiment, the polymer does not form on the wafer surface but forms within the recess. In the third embodiment, an etch occurs on the wafer surface while the polymer forms within the recess. The deposition rate of the polymer on the wafer surface can be decreased as compared to the polymer formation within the recess by various means, such as by decreasing the source power, by decreasing the flow rate, by increasing the bias power, or by using a combination of these parameters. Other methods of controlling the deposition rate may also be possible and apparent to one of skill in the art from reviewing the information herein. These other methods fall within the scope of the invention.

While this invention has been described with reference to illustrative embodiments, this description is not meant to be construed in a limiting sense. Various modifications of the illustrative embodiments, as well as additional embodiments of the invention, will be apparent to persons skilled in the art upon reference to this description. For example, the etch resistant layer can be formed within any recess such as a trench, via, contact, depression in an exposed surface with modifications to the etcher settings. Depending on the size of the recess, the etcher settings may require modification, which can be determined without undue experimentation from the disclosure herein. Also, the recess can be formed in an oxide layer as shown herein, or can be formed within the wafer substrate, between two protruding features, or in other layers. The term "wafer assembly" is used to describe a raw substrate, a substrate with doped regions therein, or a substrate with a layer or layers such as oxide or nitride thereon. The plasma-deposited material can comprise polymers including (but not limited to) carbon and either a halogen and/or hydrogen or various other materials. It is therefore contemplated that the appended claims will cover any such modifications or embodiments as fall within the true scope of the invention.

What is claimed is:

1. A method of developing an in-process semiconductor device having a first metal line and a second metal line, comprising:

placing said device in a deposition and etch surrounding;

forming a polymer between said first metal line and said second metal line providing a layer over said polymer; and retaining a state of said polymer.

2. The method in claim 1, wherein said step of retaining said state of said polymer further comprises having a polymer with a thermal stability sufficient to withstand providing said layer.

3. The method in claim 2, wherein said step of providing said layer further comprises providing said layer outside of said deposition and etch surrounding.

* * * * *

UNITED STATES PATENT AND TRADEMARK OFFICE
CERTIFICATE OF CORRECTION

PATENT NO. : 6,716,769 B1 Page 1 of 1
APPLICATION NO. : 09/470650
DATED : April 6, 2004
INVENTOR(S) : Thomas A. Figura et al.

It is certified that error appears in the above-identified patent and that said Letters Patent is hereby corrected as shown below:

At column 2, line 17, replace "drawing" with -- drawings --.

Signed and Sealed this

Fifth Day of February, 2008

JON W. DUDAS
*Director of the United States Patent and Trademark Office*